US008043487B2

(12) United States Patent  
Li et al.

(10) Patent No.: US 8,043,487 B2  
(45) Date of Patent: Oct. 25, 2011

(54) CHAMBER SHIELD FOR VACUUM PHYSICAL VAPOR DEPOSITION

(75) Inventors: Youming Li, San Jose, CA (US); Jeffrey Birkmeyer, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 492 days.

(21) Appl. No.: 12/334,279

(22) Filed: Dec. 12, 2008

(65) Prior Publication Data

US 2010/0147681 A1 Jun. 17, 2010

(51) Int. Cl.
C23C 14/00 (2006.01)
(52) U.S. Cl. .............................. 204/298.11; 204/298.14
(58) Field of Classification Search ............. 204/298.08, 204/298.01, 298.11
See application file for complete search history.

(56) References Cited

U.S. PATENT DOCUMENTS

| | | | |
|---|---|---|---|
| 4,622,122 A | 11/1986 | Landau | |
| 5,202,008 A | 4/1993 | Talieh et al. | |
| 5,234,561 A | 8/1993 | Randhawa et al. | |
| 6,227,140 B1 | 5/2001 | Kennedy et al. | |
| 6,726,805 B2 | 4/2004 | Brown et al. | |
| 7,001,491 B2 * | 2/2006 | Lombardi et al. | 204/192.12 |
| 7,368,041 B2 | 5/2008 | Krassnitzer | |
| 7,382,661 B1 | 6/2008 | Lin | |
| 2010/0147680 A1 | 6/2010 | Li et al. | |

FOREIGN PATENT DOCUMENTS

| | | |
|---|---|---|
| JP | 2007-042818 | 2/2007 |
| KR | 10-2000-0051498 | 8/2000 |
| KR | 10-0779885 | 11/2007 |

OTHER PUBLICATIONS

Authorized Officer Byul Sup Lee, Korean Intellectual Property Office, International Search Report and Written Opinion for International Application No. PCT/US2009/067145, dated Jul. 5, 2010, 8 pages.

* cited by examiner

*Primary Examiner* — Stephen Rosasco  
(74) *Attorney, Agent, or Firm* — Fish & Richardson P.C.

(57) ABSTRACT

A physical vapor deposition apparatus includes a vacuum chamber with side walls, a cathode, a radio frequency power supply, a substrate support, and anode, and a shield. The cathode is inside the vacuum chamber and includes a sputtering target. The radio frequency power supply is configured to apply power to the cathode. The substrate support is inside and electrically isolated from the side walls of the vacuum chamber. The anode is inside and electrically connected to the side walls of the vacuum chamber. The shield is inside and electrically connected to the side walls of the vacuum chamber and includes an annular body and a plurality of concentric annular projections extending from the annular body.

25 Claims, 5 Drawing Sheets

CHAMBER SHIELD FOR VACUUM PHYSICAL VAPOR DEPOSITION

BACKGROUND

The present disclosure relates generally to radio frequency (RF) sputtering physical vapor deposition (PVD) and more particularly to a shaped shield and a chamber shield for an RF sputtering PVD apparatus.

Radio frequency sputtering PVD is a method for depositing a thin film on a substrate. The substrate is placed in a vacuum chamber facing a target that is connected to an RF power supply. When the RF power is initiated, a plasma is formed. Positive gas ions are pulled to the target surface, strike the target, and remove target atoms by momentum transfer. The removed target atoms then deposit on the substrate to form a thin film layer.

During physical vapor deposition, it can be important to control the properties of the deposited thin film. Problems can arise in the stability of the process or the film as a result of plasma spread-out toward the vacuum chamber walls or reversal of deposition.

SUMMARY

In general, in one aspect, a physical vapor deposition apparatus includes a vacuum chamber with side walls, a cathode, a radio frequency power supply, a substrate support, an anode, and a shield. The cathode is inside the vacuum chamber and includes a sputtering target. The radio frequency power supply is configured to apply power to the cathode. The substrate support is inside and electrically isolated from the side walls of the vacuum chamber. The anode is inside and electrically connected to the side walls of the vacuum chamber. The shield is inside and electrically connected to the side walls of the vacuum chamber and includes an annular body and a plurality of concentric annular projections extending from the annular body.

These and other embodiments can optionally include one or more of the following features. The plurality of concentric annular projections can extend towards the cathode. The height of an annular projection that is closer to the sidewalls can be greater than the height of an annular projection that is further from the sidewalls. The height of each of the concentric annular projections can increase along a radius from the center of the vacuum chamber to the sidewalls. An annular opening inside the second shield can have approximately the same radius as the substrate support.

The target can include lead zirconate titinate ("PZT"). The vacuum chamber can include at least one of: a vacuum pump, a process gas control device, or a pressure measurement device. The target can be bonded to a metallic backing plate. The cathode can include a magnetron assembly.

In general, in another aspect, a physical vapor deposition apparatus includes a vacuum chamber with side walls, a cathode, a radio frequency power supply, a substrate support, an anode, a first shield, and a second shield. The cathode is inside the vacuum chamber and includes a sputtering target. The radio frequency power supply is configured to apply power to the cathode. The substrate support is inside and electrically isolated from the side walls of the vacuum chamber. The anode is inside and electrically connected to the side walls of the vacuum chamber. The first shield is inside and electrically connected to the side walls of the vacuum chamber. The second shield is electrically connected to the side walls of the vacuum chamber and positioned between the side walls of the chamber and the first shield. A height of the second shield is at least as great as a height of the first shield.

These and other embodiments can optionally include one or more of the following features. A height of the second shield can be greater than a height of the first shield. The second shield can include an annular body and an annular flange extending inwardly from the annular body. The annular flange can extend below an annular flange of the first shield. The second shield can be configured to be removable from the chamber.

The second shield can be electrically connected to the first shield. The second shield can be electrically connected to the first shield with an electrically conductive body, and the electrically conductive body can be configured to permit gas flow between the first and second shields. The electrically conductive body can include at least one strap connecting the first shield and the second shield.

The target can include lead zirconate titinate ("PZT"). The vacuum chamber can include at least one of: a vacuum pump, a process gas control device, or a pressure measurement device. The target can be bonded to a metallic backing plate. The cathode can include a magnetron assembly.

Certain implementations may have one or more of the following advantages. The anode can be designed such that there is sufficient surface area for both collection and electrical grounding of the returned RF current from the plasma discharge. An electrically conductive body connecting the anode and the shield can reduce the spill-out of plasma toward the outside of the plasma discharge region by bringing the shield to the same potential as the grounded anode. Increasing the RF shield surface area can stabilize the deposition process by increasing the total anode to cathode surface area. A second shield can reduce the amount of target material deposition on the chamber wall.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

When RF physical vapor deposition, or sputtering, is used to create a thin film on a substrate, there can be variations in plasma density or presence of plasma within the vacuum chamber at undesirable locations, e.g., between the anode and shield, which can lead to variations in properties of the deposited film. The properties of the deposited film can be controlled by altering the geometry, size, and shape of the anode, shield, and electrical connections between the anode and the shield.

Figure 1:
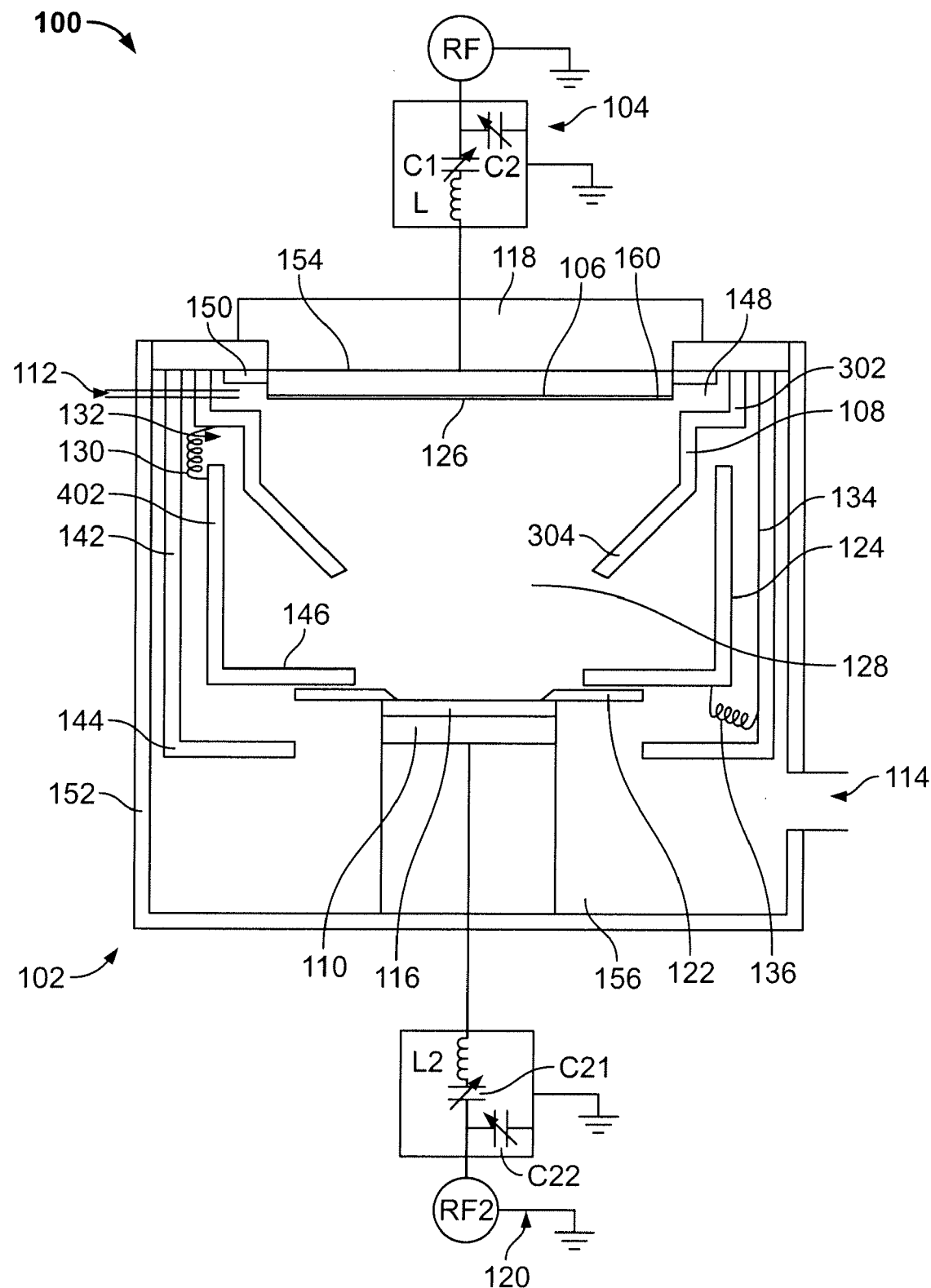
FIG. 1 is a schematic of a cross-section of an embodiment of a physical vapor deposition apparatus including an extended anode.

Referring to FIG. 1, a physical vapor deposition apparatus 100 can include a vacuum chamber 102. The vacuum chamber 102 can be cylindrical and have side walls 152, a top surface 154, and bottom surface 156. A magnetron assembly 118 can be located at the top of vacuum chamber 102. The magnetron assembly 118 can include a set of magnets having alternating magnetic poles. The magnetron assembly 118 can be stationary or can rotate about an axis perpendicular to a radius of vacuum chamber 102. The physical vapor deposition apparatus 100 can further include an RF power supply 104 and a corresponding load matching network.

A chuck or substrate support 110 to support one or more substrates can be housed inside vacuum chamber 102 near, but spaced above, the bottom surface 156 of the vacuum chamber 102. The substrate support 110 can include a substrate holding mechanism 122, such as a substrate clamping plate, configured to hold substrate 116 such that substrate 116 can be coated with a thin film during the PVD process. The substrate support 110 can be electrically isolated from ground, making it possible to independently bias the substrate support 110 with a power source, such as a DC voltage or an RF power source 120. A temperature control (not shown) can be located on the substrate support 110 to, for example, maintain the temperature of substrate 116 at a prescribed temperature up to 700 C.

A cathode assembly 106 can be housed inside and near the top surface 154 of vacuum chamber 102. The cathode assembly 106 can include a target 126 that can be bonded to a metallic backing plate (not shown). The target 106 can be generally circular, with an outer edge 160. The target can be made of, for example, lead zirconate titinate ("PZT"). Cathode 106 can act as an electrode for RF current when RF power is applied by RF power supply 104. Cathode assembly 106 can be electrically isolated from the vacuum chamber 102 by an insulator ring 150.

An anode 108 can also be housed inside vacuum chamber 102. The anode 108 can provide a counterpart electrode to the cathode 106 so as to provide an RF current return path. In some embodiments, the anode 108 and the substrate support 110 can be the same component. In other embodiments, however, as shown in FIG. 1, the anode 108 may be electrically isolated from the substrate support 110 so that the substrate support 110 can be floating or held at a different potential than the anode 108. The anode can be grounded, i.e., electrically connected in this context (the anode need not be actually connected to ground), to the vacuum chamber sidewalls 152.

Figure 1A:
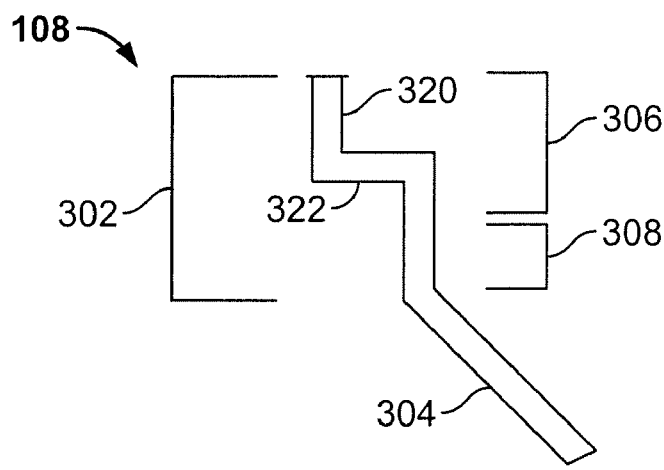
FIG. 1A is an enlarged view of the extended anode of FIG. 1.
Figure 2:
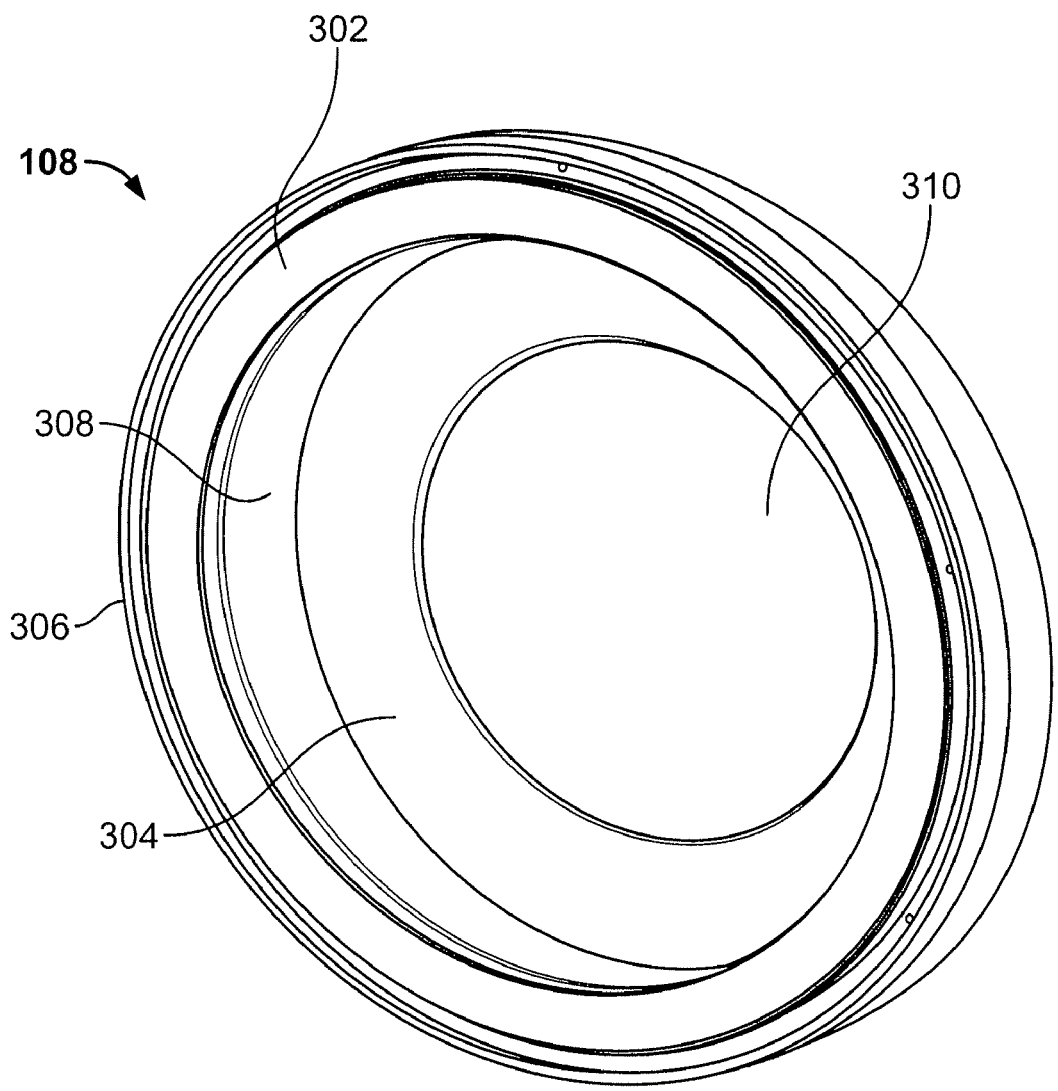
FIG. 2 shows a perspective view of an anode for use in a physical vapor deposition apparatus.

Referring to FIGS. 1, 1A, and 2, the anode 108 can have an annular body 302 and can be extended by an annular flange 304 projecting inwardly from the annular body 302. The annular flange 304 can define an intended discharge space 128 (see FIG. 1) in which plasma can be retained during the PVD process. As shown in FIGS. 1A and 2, the annular body 302 can comprise an upper portion 306 and a lower portion 308. The upper portion 306 can be closer to the cathode 106 than the lower portion 308. The spacing 148 (see FIG. 1) between the upper portion 306 and the top surface 154 of vacuum chamber 102 can be configured to prevent plasma formation therebetween.

Shown in FIG. 1A, a top portion 320 of the upper portion 306 of the anode can extend vertically, e.g., it can be a cylinder, from the top surface 154 of the vacuum chamber. The top portion 320 can be parallel to and surround edge 160 of target 126. A bottom portion 322 of the upper portion 306 can extend, e.g. perpendicularly, inwardly from an inside surface at the bottom edge of top portion 320. Bottom portion 322 can extend substantially horizontally inwardly, e.g., as a horizontal ring. The inner radius of the ring 322 can have approximately the same radius as target 126. Lower portion 308 can extend from a lower surface and an inner edge of bottom portion 322. Lower portion 308 can extend perpendicularly from bottom portion 322 and can extend vertically, e.g. as a cylinder. An inside wall of the cylinder can have approximately the same radius as target 126. Although not shown, another projection can extend downwardly from the lower surface of bottom portion 322 near the outside edge such that a gap is formed for the placement of an upper portion of shield 124.

Figure 3:
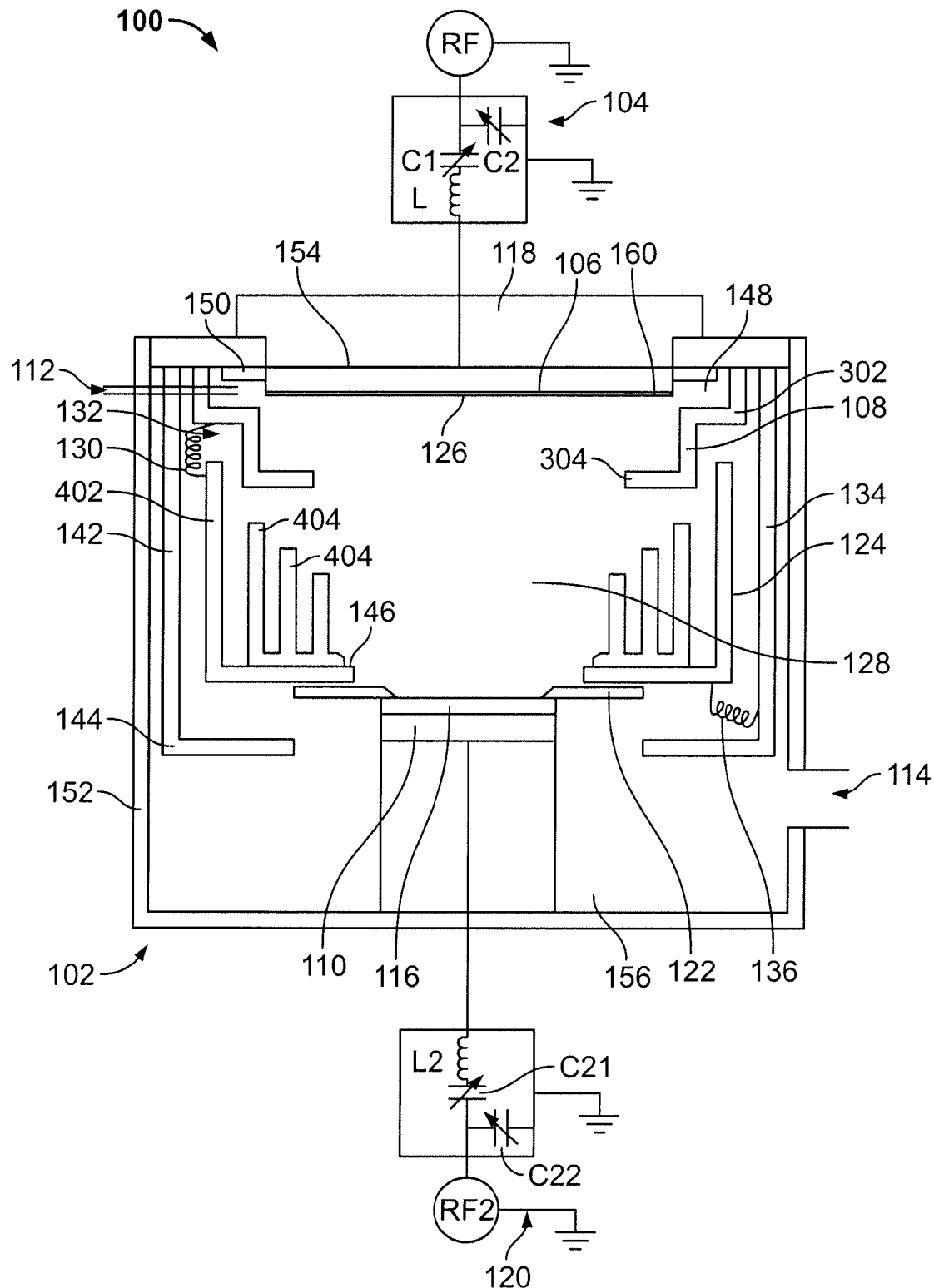
FIG. 3 is a schematic of a cross-section of an embodiment of a physical vapor deposition apparatus including an extended shield.

The annular flange 304 can project inwardly from the lower portion 308 such that at least some of the flange extends below target 126. As shown in FIG. 1, the flange 304 can extend inwardly and downwardly from the annular body 302 such that the radius of the flange 304 closer to the cathode 106 is larger than the radius of the flange 304 further from the cathode 106, i.e. the flange can have a funnel shape. Alternatively, as shown in FIG. 3, the flange 304 can extend horizontally from the annular body 302. In some embodiments, the flange 304 extends from the lowermost edge of the lower portion 308.

An annular opening 310 (see FIG. 2) can have approximately the same radius as the substrate support 110 such that there is no substantial shadowing of the substrate 116 during the PVD process, i.e. such that the entire top surface of substrate 116 can be covered with a thin film.

The vacuum chamber 102 can also include an RF shield 124 to protect the sidewalls of vacuum chamber 102 from being coated with thin film material. The shield 124 can be made, for example, of non-magnetic stainless steel or aluminum and can be grounded to the sidewalls 152 of the vacuum chamber 102.

In some implementations, the shield 124 includes an annular body 402 that extends vertically, e.g. in a cylindrical shape. A horizontally extending flange 146 can extend inwardly from a bottom edge of the annular body 402. The horizontally extending flange 146 can be located near the bottom of the vacuum chamber 102 and can extend past the flange 304 to surround and partially vertically overlap the lower portion 308 of the anode 108. In some embodiments, the vertically extending flange 146 can extend into a gap between the lower portion 308 of the anode 108 and substrate holding mechanism 122. The flange 146 can partially horizontally overlap the substrate holding mechanism 122.

The annular opening 406 (see FIG. 4) inside the annular flange 146 of the shield 124 can have approximately the same radius as the substrate support such that there is no substantial shadowing of the substrate 116. A gap 132 can exist between the shield 124 and the anode 108 in order to permit process gas to be evacuated from the intended discharge space 128.

Figure 3A:
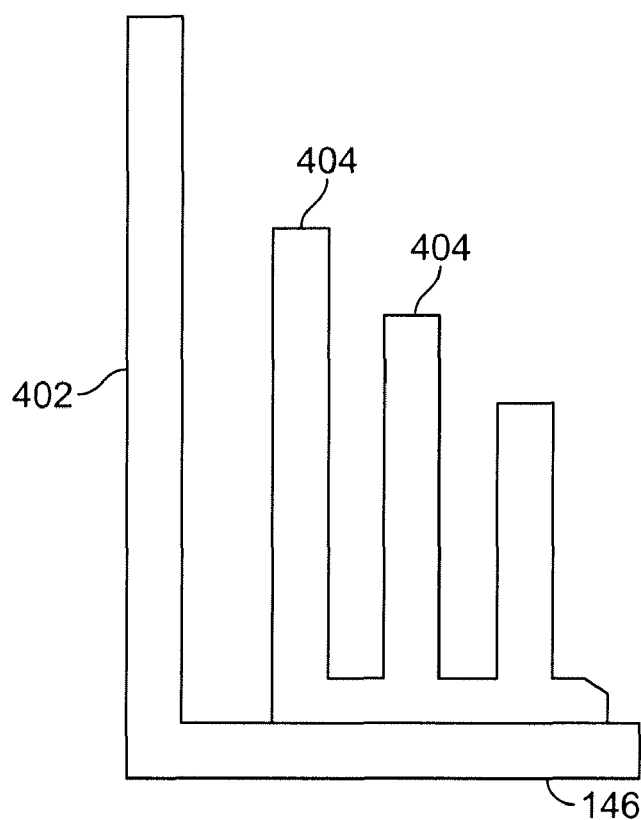
FIG. 3A is an enlarged view of the extended shield of FIG. 3.
Figure 4:
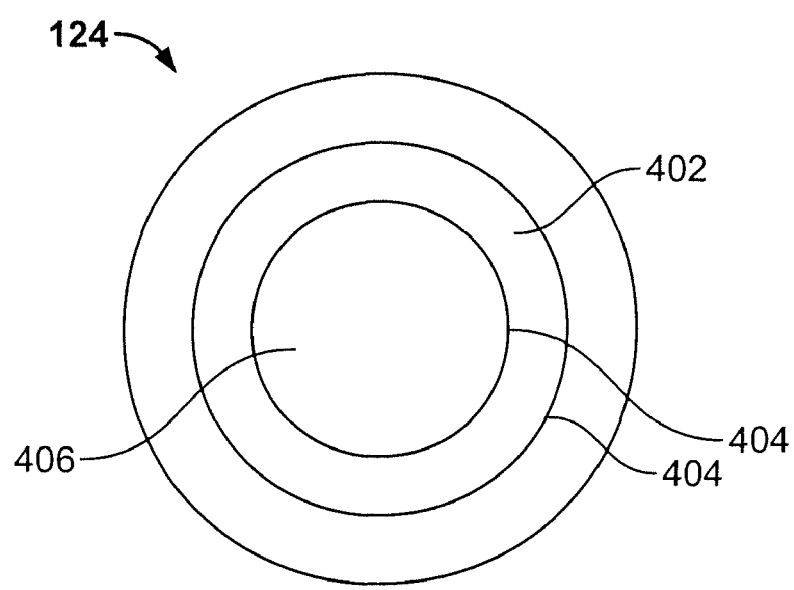
FIG. 4 is a schematic view of the top of a shield for use in a physical vapor deposition apparatus.

Referring to FIGS. 3, 3A, and 4, in some embodiments, the shield can be extended such that a set of concentric annular projections 404 projects from the annular flange 146, for example towards the cathode 106. The annular projections 404 can extend parallel to annular body 402. As shown in FIG. 3, the height of the annular projections 404 can increase along a radius from the center of the vacuum chamber to the sidewalls. The annular body 402 can have a height that is taller than the height of the annular projections 404.

Referring back to FIG. 1, the physical vapor deposition apparatus 102 can include an electrically conductive body 130, for example a strap, that directly connects the anode 108 and the shield 124. The electrically conductive body 130 can be flexible and can be configured to permit gas flow between the anode 108 and shield 124. For example, the electrically conductive body 130 can be a mesh or a wire strap. The electrically conductive body 130 can be made, for example, of copper or aluminum.

There can be a number of connections between the anode 108 and shield 124. For example, the electrically conductive body 130 can be connected to the anode 108 and the shield 124 at at least four points. As shown in FIG. 1, the electrically conductive body 130 can be connected between a lower surface of the anode 108 and a top portion of the shield 124. The electrically conductive body 130 can also be connected between a top portion of the anode 108 and an outer surface of the shield 124.

Referring back to FIG. 1, the physical vapor deposition apparatus 100 can further include a secondary chamber shield 134. The chamber shield can be made of, for example, non-magnetic stainless steel or aluminum. An upper portion of the chamber shield can be positioned between the anode 108 and the sidewalls of the vacuum chamber 102. A lower portion of the chamber shield 134 can be positioned between the sidewalls of the vacuum chamber 102 and shield 124. The chamber shield 134 can be concentric with and surround shield 124 and/or anode 108. The height of the chamber shield 134 can be equal to or greater than the height of shield 124. The chamber shield 134 can include a vertical annular body 142 and an annular flange 144 extending inwardly from the annular body 142, e.g., from the lower edge of the vertical annular body 142. The annular flange 144 of the chamber shield 134 can extend below the annular flange 146 of shield 124, but can have a radial length that is shorter than the annular flange 146. The annular flange 144 can be closer to the bottom of the chamber than the substrate support 122. The inner edge of the flange 144 of the chamber shield can be vertically aligned with the outer edge of the substrate support 122.

The chamber shield 130 can be configured such that process gases may still be pumped into and out of the vacuum chamber 102. For example, the chamber shield 134 may be short enough so as not to cover the gas inlet 142 or the vacuum inlet 114. Alternatively, the chamber shield 134 may have holes (not shown) in locations corresponding to the locations of gas inlet 142 and vacuum inlet 114. Furthermore, the chamber shield 134 can be separately removable and can be cleaned easily and reused over time.

As shown in FIG. 1, the chamber shield 134 can be electrically bonded to shield 124 with an electrically conductive body 136. The electrically conductive body 136 can be of similar material and shape as electrically conductive body 130. Thus, the electrically conductive body 136 can be configured to permit gas flow between shield 124 and chamber shield 134. Likewise, the electrically conductive body 136 can be composed of mesh, can be one or more strap, and can comprise copper or aluminum. Moreover, the electrically conductive body 136 can be connected between a bottom surface of shield 124 and an inner surface of chamber shield 134.

The physical vapor deposition apparatus 100 can further include a process gas inlet 112, process gas control devices (not shown), a vacuum inlet 114, pressure measurement and control devices (not shown), and vacuum pumps (not shown).

During the sputtering or PVD process, gases, such as argon and oxygen, can be supplied through the gas inlet 112. A vacuum pump (not shown) can maintain a base vacuum, for example, of $10^{-7}$ Torr or below, and a plasma operation pressure, for example, of 0.5 mTorr to 20 mTorr, through vacuum inlet 114. When the RF power supply 104 on the order of 500 W to 5,000, for example 2000 W to 4,000 W, or 3000 W, is applied to the cathode assembly 106, the target 126 is negatively biased and the anode 108 is positively biased, causing plasma to form in the intended discharge space 128 between the cathode 104 and the anode 108. The magnetron assembly 118 can create a magnetic field of, for example 50 Gauss to 400 Gauss, such as 200 Gauss to 300 Gauss, at and near the front surface of the cathode 106. The magnetic field can confine the electrons to a helical motion parallel to the front surface of target 126.

The negative self bias DC voltage on target 126, in conjunction with the electrons confined near the surface of target 126 by the magnetic field, causing the sputtering gas to ionize to produce positive ions of nonreactive gas, facilitates bombardment of the target 126 by the energetic positive ions. Momentum transfer can cause neutral target material, such as PZT molecules, to dislocate from the target 106 and deposit on substrate 116, creating a thin film on substrate 116.

Substrate 116 can be biased negatively with respect to the ground by the substrate RF bias power supply 120. Such a bias can be useful for knocking extra target atoms off of the surface, such as for etching the substrate surface.

Because the sputtered material is ejected from the target in all directions in the vacuum chamber 102, surfaces other than the surface of substrate 116 may be coated. Thus, for example, when the target 126 is a dielectric material, the anode 108 and shield 124 surfaces may become covered with an electrically insulating material. As a result, there can be poor electrical conduction to provide the RF current return pass to ground, resulting in intermittent secondary plasma formation between various parts of the anode 108, shield 124, and sidewalls 152 of the vacuum chamber 102. Such unstable plasma conditions can result in further deposition of target material on unintended surfaces.

In addition, plasma can form in areas outside of the intended discharge space 128, resulting in deposition of target material on unintended surfaces, when the coating process requires either a high level of RF power applied to the cathode 106 or a wide range of sputtering gas pressure. For example, at high RF power, such as 2000 W and above, plasma can spread toward the walls of vacuum chamber 102 due to an increase in plasma intensity. As another example, at a pressure range from 3.0 to 7.0 millitorr, the plasma can start to oscillate between the upper space directly below the target 106 and the entire intended discharge space 128. This can result both in unstable plasma conditions and in a reversal of the sputter deposition mode such that material from the substrate 116 is deposited on the target 126 rather than material from target 126 being deposited on substrate 116. However, as discussed below, these problems can be ameliorated with an anode flange and conductive straps.

The physical characteristics of the plasma can be controlled by using proper sputtering gas pressure, RF power to the cathode, and bias power on the substrate. Additionally, the distribution of plasma can be controlled by creating a spatial volume inside the vacuum chamber defined by the shape, size, and relative positions of the cathode 106, anode 108, and substrate wafer 116 on wafer support 110.

For example, if the total anode 108 surface area is much greater than the total cathode 106 surface area, then RF current can be better conducted to ground, and plasma formation can be more stable. Thus, if the anode 108 is extended, as discussed above, the anode surface area can be increased to collect any potential leakage of plasma through the gap 132 between the anode 108 and the shield 124. The increased anode surface area and its physical shape can act further as a spatial collimator for the plasma discharge such that the deposition uniformity on substrate 116 can be improved.

Figure 6:
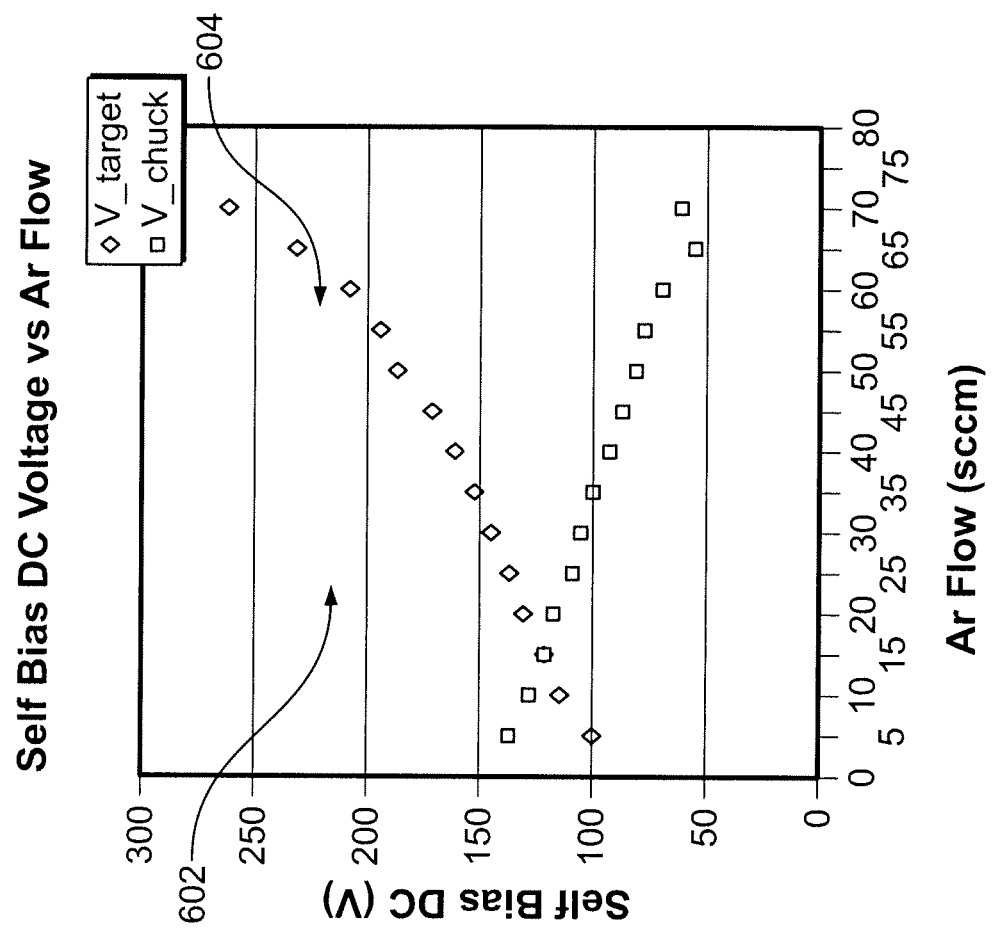
FIG. 6 illustrates an example graph relating self bias DC voltage to gas flow for a physical vapor deposition apparatus including an extended anode.
Figure 5:
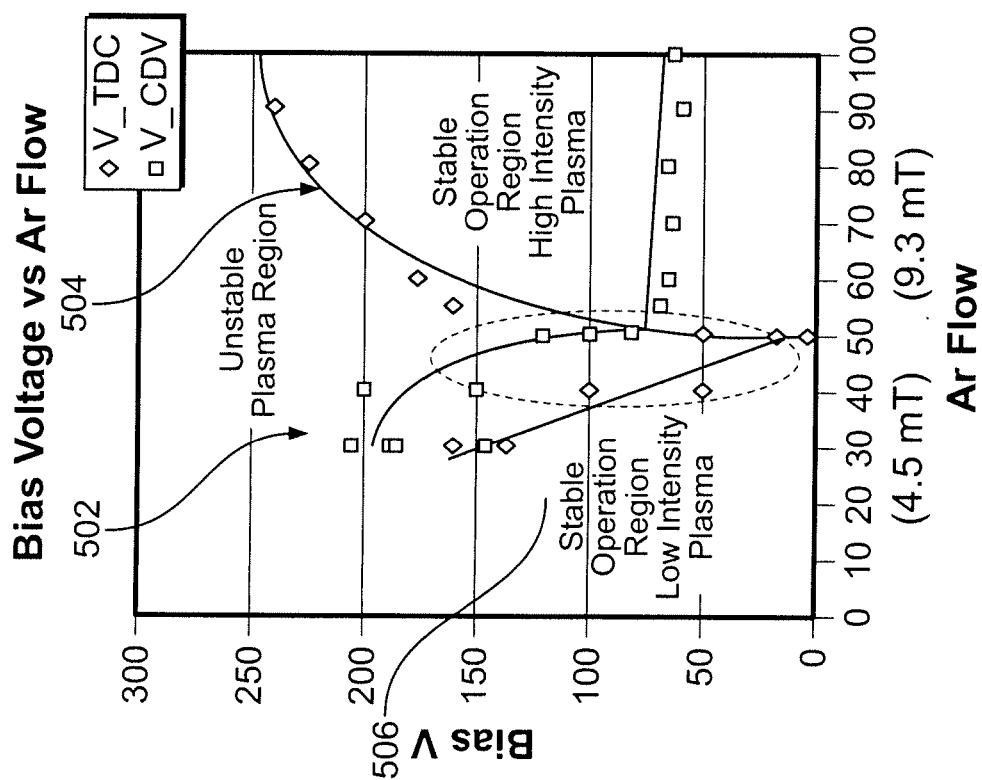
FIG. 5 illustrates an example graph relating self bias DC voltage to gas flow for a physical vapor deposition apparatus without an extended anode.

As shown in FIG. 5, if the anode does not have an extended surface area, the target bias 502 and the substrate support bias 504 can be nonfunctionally related to the gas pressure between 3.0 and 7.0 millitorr (see area 506). This pressure range can correspond to the formation of unstable plasma, as discussed above. On the other hand, as shown in FIG. 6, if the anode has an extended surface area, the target bias 602 and the substrate support bias 604 can each be functionally related to the gas pressure, and plasma formation can be stable throughout the process.

Likewise, the annular projections 404 on shield 124 can effectively increase the anode area in contact with the plasma such that the total anode to cathode ratio is substantially increased.

As another example, if the shield 124 is brought to the same potential as anode 108, then the shield can act as a secondary anode in addition to physically blocking plasma from spreading to the walls. In some embodiments, the shield can develop portions of localized charge variations, particularly in areas furthest away from electrical connections. Thus, the space between the anode 108 and the shield 124 can create a capacitance bridge, which can lead to the oscillation of plasma. However, if an electrically conductive body 130, as discussed above, is placed between the anode 108 and the shield 124, the shield 124 can be brought to approximately the same RF electrical potential of the anode 108 such that there is little discontinuity or variance between the shield and the anode. As a result, the spill-out of plasma toward the outside of the plasma discharge region can be suppressed, thereby reducing the deposition of target materials on the interior surface of the vacuum chamber 102.

Likewise, the placement of a secondary chamber shield 134 between the walls of the vacuum chamber 102 and the shield 124 can reduce the amount of target material deposited on the vacuum wall. Moreover, by electrically bonding the chamber shield 134 to the anode 124 through a conductive body 136, the chamber shield can be at the same electrical potential as the anode 108 and the shield 124. Thus, the possibility of stray plasma creation outside the intended discharge space 129 can be reduced.

It should be understood that terms of positioning and orientation (e.g., top, vertical) have been used to describe the relative positioning and orientation of components within the physical vapor deposition apparatus, but the physical vapor deposition apparatus itself can be held in a vertical or horizontal orientation or some other orientation.

Particular embodiments of the invention have been described. Other embodiments are within the scope of the following claims.

What is claimed is:

1. A physical vapor deposition apparatus comprising:
a vacuum chamber having side walls;
a cathode inside the vacuum chamber, wherein the cathode is configured to include a sputtering target;
a radio frequency power supply configured to apply power to the cathode;
a substrate support inside and electrically isolated from the side walls of the vacuum chamber;
an anode inside and electrically connected to the side walls of the vacuum chamber; and
a shield inside and electrically connected to the side walls of the vacuum chamber, wherein the shield comprises an annular body and a plurality of concentric annular projections extending from the annular body.

2. The physical vapor deposition apparatus of claim 1, wherein the plurality of concentric annular projections extend towards the cathode.

3. The physical vapor deposition apparatus of claim 1, wherein each of the concentric annular projections in the plurality of annular projections has a height, and wherein the height of a first annular projection that is closer to the side walls is greater than the height of a second annular projection that is further from the side walls.

4. The physical vapor deposition apparatus of claim 1, wherein a height of each of the concentric annular projections in the plurality of annular projections increases along a radius from a center of the vacuum chamber to the side walls.

5. The physical vapor deposition apparatus of claim 1, wherein an annular opening inside the shield has approximately the same radius as the substrate support.

6. The physical vapor deposition apparatus of claim 1, wherein the target comprises lead zirconate titinate ("PZT").

7. The physical vapor deposition apparatus of claim 1, wherein the vacuum chamber comprises at least one vacuum pump.

8. The physical vapor deposition apparatus of claim 1, further comprising at least one process gas control device.

9. The physical vapor deposition apparatus of claim 1, further comprising at least one pressure measurement device.

10. The physical vapor deposition apparatus of claim 1, wherein the cathode further comprises a metallic backing plate configured to be bonded to the target.

11. The physical vapor deposition apparatus of claim 1, wherein the cathode further comprises a magnetron assembly.

12. A physical vapor deposition apparatus comprising:
a vacuum chamber having side walls;
a cathode inside the vacuum chamber, wherein the cathode is configured to include a sputtering target;
a radio frequency power supply configured to apply power to the cathode;
a substrate support inside and electrically isolated from the side walls of the vacuum chamber;
an anode inside and electrically connected to the side walls of the vacuum chamber;
a first shield inside and electrically connected to the side walls of the vacuum chamber; and
a second shield electrically connected to the side walls of the vacuum chamber and positioned between the side walls of the chamber and the first shield, wherein a height of the second shield is at least as great as a height of the first shield.

13. The physical vapor deposition apparatus of claim 12, wherein the height of the second shield is greater than the height of the first shield.

14. The physical vapor deposition apparatus of claim 12, wherein the second shield comprises an annular body and an annular flange extending inwardly from the annular body.

15. The physical vapor deposition apparatus of claim 12, wherein the annular flange extends below an annular flange of the first shield.

16. The physical vapor deposition apparatus of claim 12, wherein the second shield is configured to be removable from the vacuum chamber.

17. The physical vapor deposition apparatus of claim 12, wherein the second shield is electrically connected to the first shield.

18. The physical vapor deposition apparatus of claim 12, wherein the second shield is electrically connected to the first shield with an electrically conductive body, the electrically conductive body configured to permit gas flow between the first shield and the second shield.

19. The physical vapor deposition apparatus of claim 18, wherein the electrically conductive body comprises at least one strap connecting the first shield and the second shield.

20. The physical vapor deposition apparatus of claim 12, wherein the target comprises lead zirconate titinate ("PZT").

21. The physical vapor deposition apparatus of claim 12, wherein the vacuum chamber comprises at least one vacuum pump.

22. The physical vapor deposition apparatus of claim 12, further comprising at least one process gas control device.

23. The physical vapor deposition apparatus of claim 12, further comprising at least one pressure measurement device.

24. The physical vapor deposition apparatus of claim 12, wherein the cathode further comprises a metallic backing plate configured to be bonded to the target.

25. The physical vapor deposition apparatus of claim 12, wherein the cathode further comprises a magnetron assembly.

* * * * *

UNITED STATES PATENT AND TRADEMARK OFFICE
CERTIFICATE OF CORRECTION

| | |
|---|---|
| PATENT NO. | : 8,043,487 B2 |
| APPLICATION NO. | : 12/334279 |
| DATED | : October 25, 2011 |
| INVENTOR(S) | : Youming Li and Jeffrey Birkmeyer |

It is certified that error appears in the above-identified patent and that said Letters Patent is hereby corrected as shown below:

<u>Column 8, Line 20</u>:

Claim 6, line 2, change "titinate" to --titanate--.

<u>Column 9, Line 7</u>:

Claim 20, line 2, change "titinate" to --titanate--.

Signed and Sealed this
Thirteenth Day of December, 2011

David J. Kappos
*Director of the United States Patent and Trademark Office*